(12) United States Patent
Kato et al.

(10) Patent No.: US 10,770,400 B2
(45) Date of Patent: Sep. 8, 2020

(54) SEMICONDUCTOR MODULE

(71) Applicant: KABUSHIKI KAISHA TOYOTA JIDOSHOKKI, Aichi-ken (JP)

(72) Inventors: Naoki Kato, Aichi-ken (JP); Shogo Mori, Aichi-ken (JP); Harumitsu Sato, Aichi-ken (JP); Hiroki Watanabe, Aichi-ken (JP); Hiroshi Yuguchi, Aichi-ken (JP); Yuri Otobe, Aichi-ken (JP)

(73) Assignee: KABUSHIKI KAISHA TOYOTA JIDOSHOKKI, Aichi (JP)

( * ) Notice: Subject to any disclaimer, the term of this patent is extended or adjusted under 35 U.S.C. 154(b) by 0 days.

(21) Appl. No.: 16/322,401

(22) PCT Filed: May 12, 2017

(86) PCT No.: PCT/JP2017/018052
§ 371 (c)(1),
(2) Date: Jan. 31, 2019

(87) PCT Pub. No.: WO2018/025463
PCT Pub. Date: Feb. 8, 2018

(65) Prior Publication Data
US 2019/0172788 A1 Jun. 6, 2019

(30) Foreign Application Priority Data

Aug. 3, 2016 (JP) .................. 2016-153084

(51) Int. Cl.
*H01L 23/12* (2006.01)
*H01L 23/538* (2006.01)
(Continued)

(52) U.S. Cl.
CPC .......... *H01L 23/5386* (2013.01); *H01L 23/48* (2013.01); *H01L 23/5385* (2013.01);
(Continued)

(58) Field of Classification Search
CPC ....... H01L 2924/00; H01L 2924/00014; H01L 2924/13055; H01L 2224/83801;
(Continued)

(56) References Cited

U.S. PATENT DOCUMENTS

| 2005/0067717 A1* | 3/2005 | Shizuno | H01L 23/5389 |
| | | | 257/784 |
| 2012/0187551 A1* | 7/2012 | Kushino | H01L 21/561 |
| | | | 257/659 |

FOREIGN PATENT DOCUMENTS

| CN | 102148215 | 6/2012 |
| JP | 2002-141454 | 5/2002 |

(Continued)

OTHER PUBLICATIONS

European Extended Search Report in related Application No. EP17836570.6, dated Jun. 19, 2019.
(Continued)

*Primary Examiner* — Robert G Bachner
(74) *Attorney, Agent, or Firm* — Greenblum & Bernstein, P.L.C.

(57) ABSTRACT

A semiconductor module includes a substrate, two bare chips (semiconductor elements) mounted on the substrate, and a case fixed to the substrate. A conductor pattern and five signal patterns are provided for each bare chip on an upper surface of an insulating substrate. Signal electrodes and the signal patterns of the bare chips are connected to by conductive plates. An insulating member is provided on connecting portions of the conductive plates.

4 Claims, 5 Drawing Sheets

(51) Int. Cl.
*H01L 25/18* (2006.01)
*H01L 23/48* (2006.01)
*H01L 23/00* (2006.01)
*H01L 25/07* (2006.01)
*H01L 25/065* (2006.01)

(52) U.S. Cl.
CPC .............. *H01L 24/01* (2013.01); *H01L 24/38* (2013.01); *H01L 24/40* (2013.01); *H01L 24/41* (2013.01); *H01L 24/84* (2013.01); *H01L 25/0655* (2013.01); *H01L 25/072* (2013.01); *H01L 25/18* (2013.01); *H01L 24/29* (2013.01); *H01L 24/37* (2013.01); *H01L 2224/0603* (2013.01); *H01L 2224/29101* (2013.01); *H01L 2224/40095* (2013.01); *H01L 2224/40997* (2013.01); *H01L 2224/40998* (2013.01); *H01L 2224/41175* (2013.01); *H01L 2224/84138* (2013.01); *H01L 2224/84801* (2013.01); *H01L 2924/00014* (2013.01); *H01L 2924/13055* (2013.01); *H01L 2924/13091* (2013.01)

(58) Field of Classification Search
CPC ....... H01L 2924/0002; H01L 2924/181; H01L 2224/84801; H01L 2924/00012; H01L 2924/15787; H01L 23/473; H01L 2924/1305; C25D 3/38; C25D 5/505; C25D 3/30; C25D 5/12; C25D 3/12; C25D 5/10; C25D 7/00; C25D 17/10; C25D 3/14; C25D 5/34; C25D 5/50; C25D 7/0614; B32B 15/01; B32B 15/20; B32B 15/00; B32B 2250/04; B32B 2311/12; B32B 2311/16; B32B 2457/00
See application file for complete search history.

(56) References Cited

FOREIGN PATENT DOCUMENTS

| | | |
|---|---|---|
| JP | 2007288044 | 11/2007 |
| JP | 2010283107 | 12/2010 |
| JP | 2013-4943 | 1/2013 |
| JP | 2013038359 | 2/2013 |
| JP | 2015-80383 | 4/2015 |
| WO | WO2015/178296 | 11/2015 |
| WO | WO2016/059902 | 4/2016 |

OTHER PUBLICATIONS

International Search Report in International Patent Application No. PCT/JP2017/018052 (and English-language translation), dated Jul. 4, 2017.

Japanese Office Action in counterpart Japanese application No. 2016-153084, dated Dec. 25, 2019 (and English-language translation thereof).

* cited by examiner

SEMICONDUCTOR MODULE

CROSS-REFERENCE TO RELATED APPLICATIONS

This application is a National Stage of International Application No. PCT/JP2017/018052 filed May 12, 2017, claiming priority based on Japanese Patent Application No. 2016-153084 filed Aug. 3, 2016, the contents of all of which are incorporated herein by reference in their entirety.

TECHNICAL FIELD

The present invention relates to a semiconductor module.

BACKGROUND ART

A semiconductor module in which a control signal electrode (a gate electrode) of a bare chip and a control signal pattern are connected to each other by a conductor is disclosed in Patent Literature 1. A control device is connected to the control signal pattern via a signal terminal. The conductor, which is formed by, for example, bending a metallic plate, is joined to the control signal electrode and the control signal pattern by soldering. As a result, the control signal electrode and the control signal pattern are connected to each other via the conductor.

CITATION LIST

Patent Document

Patent Document 1: Japanese Patent Application Publication No. 2015-80383

SUMMARY OF INVENTION

Incidentally, the conductor needs to stand on its own before the conductor is joined to the control signal electrode and the control signal pattern by soldering. However, the conductor is a member for transmitting control signals, and small and light. Therefore, there is a risk that the conductor may fall down before the conductor is joined to the control signal electrode and the control signal pattern.

It is an object of the present invention to provide a semiconductor module capable of preventing a falling down of a conductor.

Solution to Problem

A semiconductor module that solves the above problem includes a substrate, a bare chip including a plurality of electrodes disposed on an upper surface of the bare chip and an electrode disposed on a lower surface of the bare chip, the electrode on the lower surface being mounted on the substrate, and a conductor including a first joining portion that is joined to a control signal electrode of the electrodes disposed on the upper surface of the bare chip, a second joining portion that is joined to a control signal pattern on the substrate, and a connecting portion that electrically connects the first joining portion and the second joining portion, and the connecting portion is provided with an insulating member.

According to the above structure, the weight of the insulating member is applied to the conductor, so that the conductor is easily stabilized, as compared with a case where the insulating member is not provided. Therefore, the conductor easily stands on its own even before the conductor is joined to the control signal pattern and the control signal electrode, and the falling down of the conductor is prevented.

The semiconductor module described above may include a plurality of signal electrodes that includes the control signal electrode and is provided for the one bare chip, a plurality of the conductors may be disposed respectively on the plurality of the signal electrodes, and the connecting portions of the plurality of conductors may be fixed by the single insulating member.

As a result, the plurality of conductors is fixed to the one insulating member to form an assembly. Therefore, it is not necessary to position the conductors individually when joining the conductors, so that the plurality of conductors is easily positioned.

According to the semiconductor module described above, the insulating member and the substrate may be in surface contact with each other.

With the configuration in which the insulating member and the substrate are in contact with each other, the falling down of the conductor is further prevented.

According to the semiconductor module described above, the insulating member and the substrate may be bonded to each other.

With the configuration in which the insulating member is bonded to the substrate, the falling down of the conductor is further prevented.

The semiconductor module described above includes a plurality of bare chips, and a plurality of leads is formed integrally with a case, the leads being joined to a separate electrode from a signal electrode of a plurality of electrodes disposed on an upper surface of each of the bare chips. The leads and the separate electrode are joined to each other without contacting with each other.

As a result, the plurality of leads integrated with the case is positioned by the positioning of the case before the leads are joined by a solder to the electrode that is separate from the signal electrode. Therefore, the plurality of leads is disposed collectively.

According to the semiconductor module described above, a joining portion of each of the leads has a round shape.

As a result, a solder that joins each lead and the electrode that is separate from the control signal electrode can form a fillet easily.

Advantageous Effects of Invention

According to the present invention, a falling down of a conductor is prevented.

DESCRIPTION OF EMBODIMENT

An exemplary embodiment of a semiconductor module will be described hereinafter.

Figure 1:
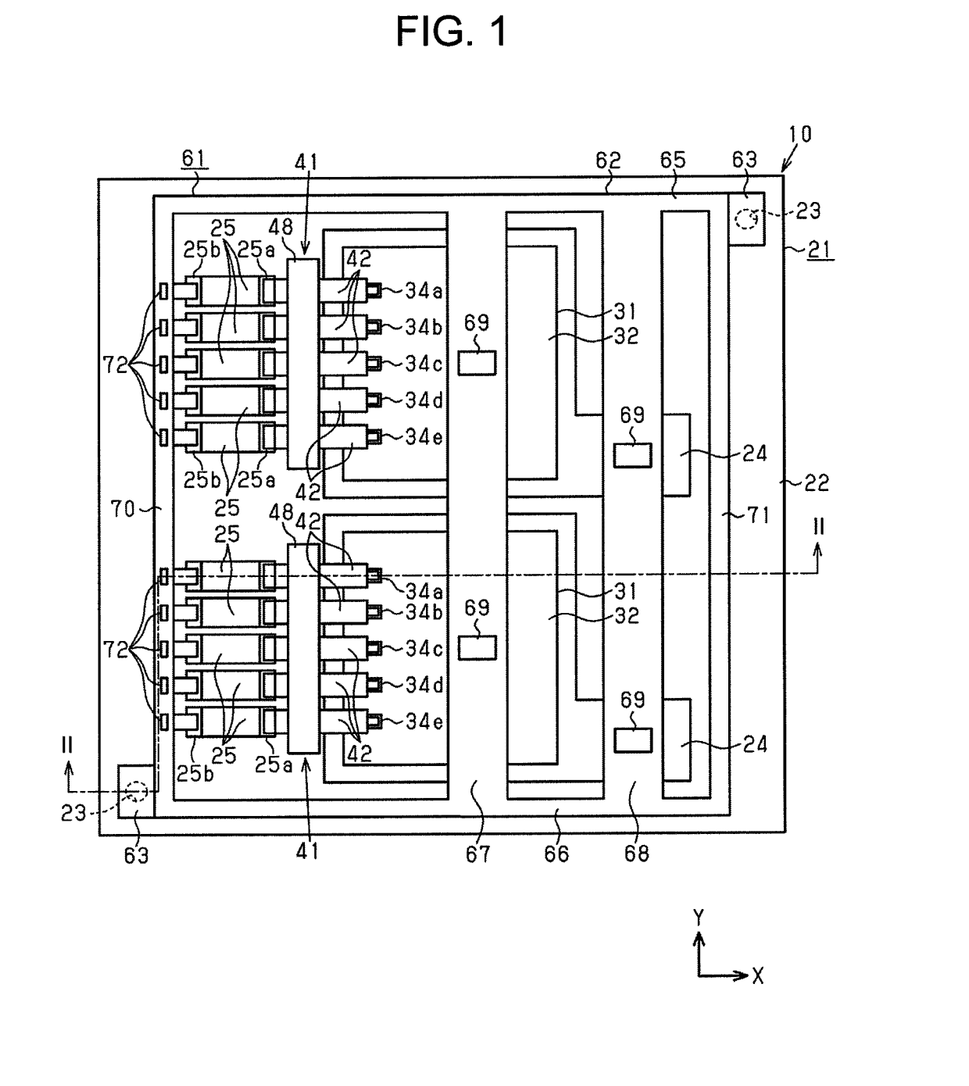
FIG. 1 is a plan view of a semiconductor module.
Figure 2:
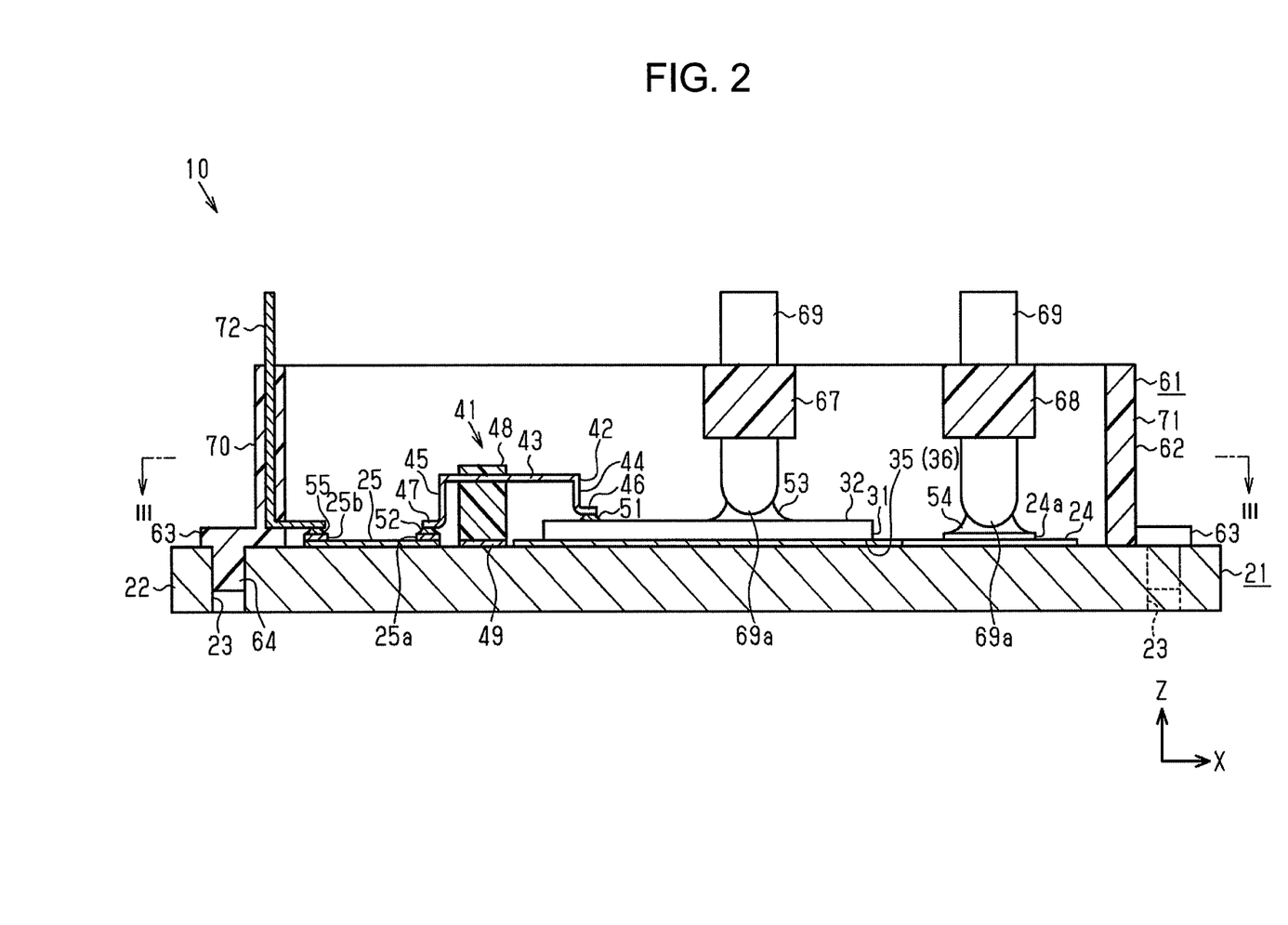
FIG. 2 is a sectional view taken along line II-II in FIG. 1 illustrating the semiconductor module.

As illustrated in FIGS. 1 and 2, a semiconductor module 10 includes a substrate 21 disposed horizontally, two bare chips (semiconductor elements) 31 mounted on the substrate 21, and a case 61 fixed to the substrate 21. The semiconductor module 10 also includes a sealing resin that is not illustrated. In FIGS. 1 to 6, a horizontal plane is defined by X, Y directions that are orthogonal to each other, and a vertical direction is defined by Z direction.

The substrate 21 includes an insulating substrate 22. At two places of the insulating substrate 22, through holes 23 extending through the insulating substrate 22 in a vertical direction (the Z direction) are provided. One conductor pattern 24 and five signal patterns 25 are provided for each of the bare chips 31 on an upper surface of the insulating substrate 22. That is, a total of two conductor patterns 24 and a total of ten signal patterns 25 are provided on the insulating substrate 22. Each of the signal patterns 25 extends in the X direction, and the ten signal patterns 25 are disposed parallel to each other in the Y direction. A pad 24a is provided on each conductor pattern 24. Further, a pad 25a and a pad 25b are provided at two places, respectively, of each of the signal patterns 25.

The bare chip 31 is joined to each conductor pattern 24. The bare chip 31 of the present exemplary embodiment is a vertical-type power MOSFET.

Figure 3:
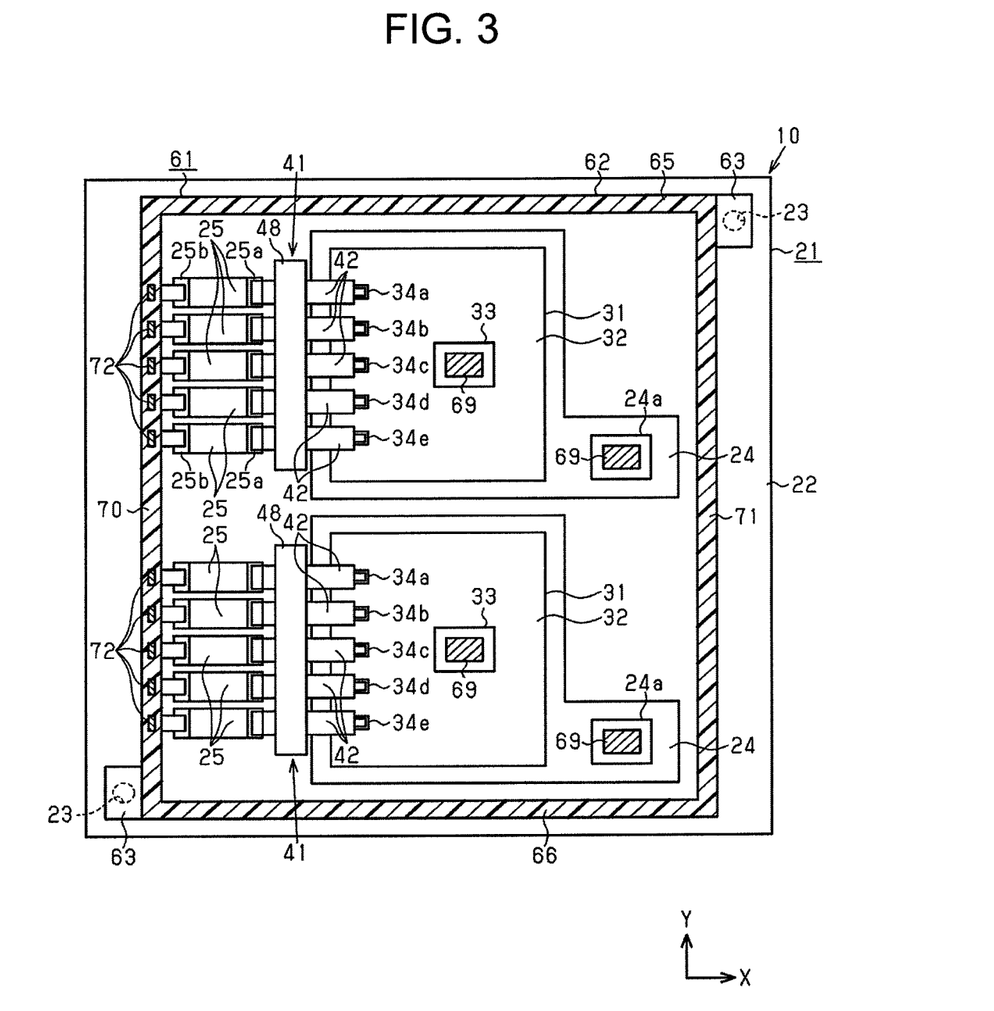
FIG. 3 is a sectional view taken along line III-III in FIG. 2 illustrating the semiconductor module.

As illustrated in FIG. 3, each of the bare chips 31 includes a source electrode 33 and signal electrodes 34a, 34b, 34c, 34d, and 34e as electrodes that are disposed on an upper surface 32. The signal electrodes 34a, 34b, 34c, 34d, and 34e of the plurality of electrodes 33, 34a, 34b, 34c, 34d, and 34e are disposed in the Y direction. That is, the plurality of signal electrodes 34a, 34b, 34c, 34d, and 34e are provided for each of the bare chips 31.

The signal electrode 34a is a control signal electrode (a gate electrode). The signal electrodes 34b and 34c are positive and negative electrodes for sensing temperatures. The signal electrodes 34d and 34e are positive and negative electrodes for sensing current.

Areas of the signal electrodes 34a, 34b, 34c, 34d, and 34e are the same. The area of the signal electrode 34a is smaller than an area of the source electrode 33, which is a separate electrode from the signal electrode 34a of the plurality of electrodes 33, 34a, 34b, 34c, 34d, and 34e that are disposed on the upper surface 32 of the bare chip 31.

As illustrated in FIG. 2, each of the bare chips 31 includes a drain electrode 36 as an electrode disposed on a lower surface 35 thereof. The drain electrode 36 is provided over the entire lower surface 35. The drain electrode 36 of each bare chip 31 is joined to the conductor pattern 24 by a conductive bonding material (not illustrated), such as a solder.

As illustrated in FIGS. 2 and 3, two conductive plate assemblies 41, each of which is formed by integrating five conductive plates (bus bars) 42 as conductors with one insulating member 48, are provided on an upper surface side of the substrate 21. The conductive plate 42 is disposed on each of the plurality of signal electrodes 34a, 34b, 34c, 34d, and 34e.

The signal electrodes 34a, 34b, 34c, 34d, and 34e of each bare chip 31 are connected to the signal patterns 25 via the conductive plates 42. Among the signal patterns 25, the signal pattern 25 that is connected to the signal electrode 34a via the conductive plate 42 is a control signal pattern.

As illustrated in FIG. 2, each conductive plate 42 is formed by bending a metal plate, and has a rectangular connecting portion 43, a first extension portion 44, a second extension portion 45, a first joining portion 46, and a second joining portion 47. The connecting portion 43 extends in the X direction. The extension portions 44 and 45 extend downward from opposite end portions of the connecting portion 43. The first joining portion 46 extends in the X direction from a lower end portion of the first extension portion 44. The second joining portion 47 extends in the X direction from a lower end portion of the second extension portion 45. The connecting portion 43 is provided between the first joining portion 46 and the second joining portion 47. The connecting portion 43 electrically connects the first joining portion 46 and the second joining portion 47 via the first extension portion 44 and the second extension portion 45. A dimension of the first extension portion 44 in the vertical direction (the Z direction) is shorter than a dimension of the second extension portion 45 in the vertical direction (the Z direction).

Figure 4:
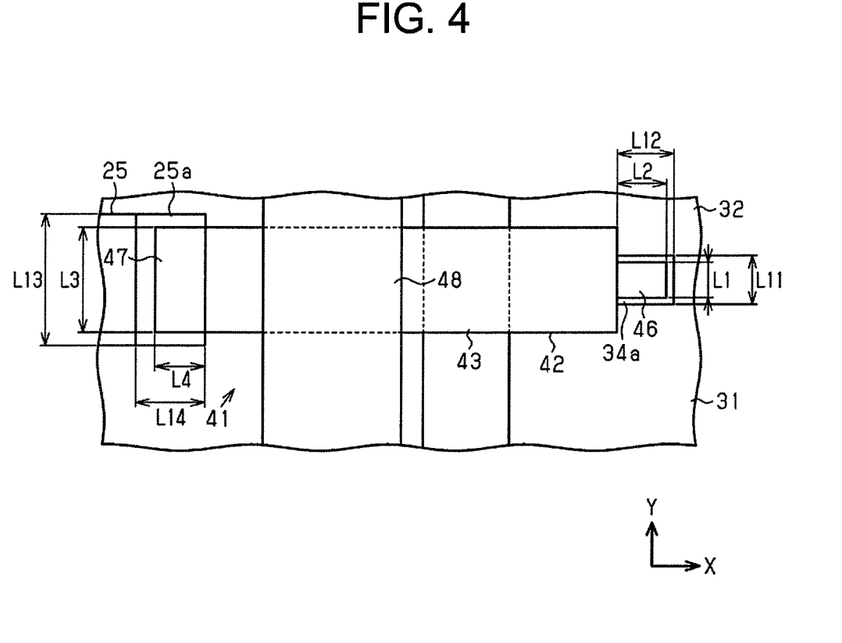
FIG. 4 is an enlarged plan view illustrating a conductive plate.

Further, as illustrated in FIG. 4, an area of the first joining portion 46 represented by L1×L2 is smaller than an area of the second joining portion 47 represented by L3×L4. Furthermore, the area of each of the signal electrodes 34a, 34b, 34c, 34d, and 34e represented by L11×L12 is smaller than an area of the pad 25a represented by L13×L14.

As illustrated in FIGS. 2 and 3, the insulating member 48 is provided on the connecting portion 43 of the conductive plates 42. One insulating member 48 is provided for each set of the five conductive plates 42, and the connecting portion 43 of each of the conductive plates 42 extends through the insulating member 48. A part of the insulating member 48 is located between the first extension portion 44 and the second extension portion 45. The insulating member 48 is formed of a synthetic resin.

The five conductive plates 42 are fixed to and integrated with the insulating member 48 (integrated into an assembly), with the intervals between the conductive plates 42 in the Y direction maintained. The intervals between the first joining portions 46 of the conductive plates 42 are the same as the intervals between the signal electrodes 34a, 34b, 34c, 34d, and 34e of each bare chip 31. The intervals between the second joining portions 47 of the conductive plates 42 are the same as the intervals between the pads 25a of the signal patterns 25.

The conductive plates 42 are disposed so that the first joining portions 46 face the signal electrodes 34a, 34b, 34c, 34d, and 34e, and the second joining portions 47 face the pads 25a of the signal patterns 25. Then, the first joining portions 46 are joined to the signal electrodes 34a, 34b, 34c, 34d, and 34e by solders 51, and the second joining portions 47 are joined to the pads 25a of the signal patterns 25 by solders 52. The solders 51 form fillets between the signal electrodes 34a, 34b, 34c, 34d, and 34e and the first joining portions 46. Further, a surface of the insulating member 48 that faces the substrate 21 is bonded to the insulating substrate 22 with an adhesive 49.

As illustrated in FIGS. 1 and 2, the case 61 is disposed on the upper surface of the substrate 21. The case 61 includes a main body 62 that has a square frame shape and two protrusions 63 that are provided at two corners of the main body 62 so as to extend from an outer surface of the main body 62. A projection 64 extends downwardly from each of the protrusions 63. A spaced distance between the two projections 64 is the same as a spaced distance between the through holes 23 provided in the insulating substrate 22. In addition, each of the two projections 64 has such a size as to be insertable into the corresponding through hole 23.

The main body 62 includes a pair of wall portions 65 and 66 extending in the X direction and a pair of wall portions 70 and 71 extending in the Y direction, and two support walls 67 and 68 are provided to extend between the first wall portion 65 and the second wall portion 66 that are opposite from each other. Two leads 69 are fixed to each of the support walls 67 and 68 in a state where each lead 69 extends in the vertical direction (the Z direction).

Figure 5:
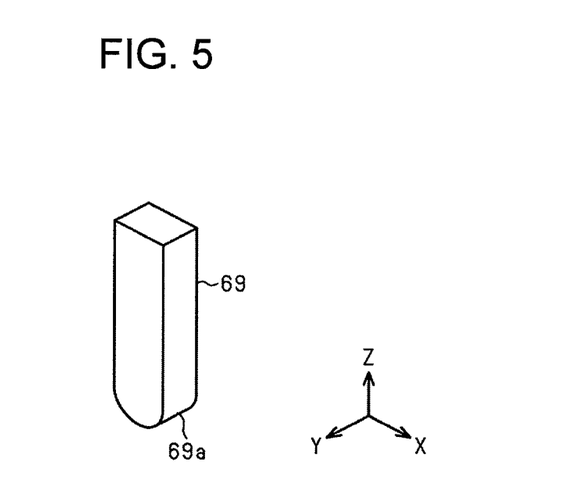
FIG. 5 is a perspective view of a lead.

As illustrated in FIG. 5, each lead 69 has a column shape with a rounded lower end 69a. Specifically speaking, part of each lead 69 excluding the lower end 69a is formed in a square column shape, and the lower end 69a is formed in an arc shape. Each lead 69 extends through the support wall 67 or 68. In addition, each lead 69 is integrally formed with the case 61.

As illustrated in FIGS. 2 and 3, signal terminals 72 are provided in the third wall portion 70 of the main body 62. Five signal terminals 72 are provided for each of the bare chips 31, that is, a total of ten signal terminals 72 is disposed in the Y direction.

Each signal terminal 72 has a bar shape. A lower end of each signal terminal 72 is bent at a right angle to have an L-shape. The lower end of each of the signal terminals 72 protrudes toward the inside of the main body 62 from the third wall portion 70. Each of the signal terminals 72 is integrated with the case 61. The leads 69 and the signal terminals 72 are provided so as to extend in the vertical direction (the Z direction) from the substrate 21. Therefore, the leads 69 and the signal terminals 72 do not protrude in the horizontal direction of the substrate 21 in a plan view of the substrate 21.

The two projections 64 of the case 61 are inserted into the two through holes 23 of the insulating substrate 22. The wall portions 65, 66, 70, and 71 of the case 61 are bonded to the insulating substrate 22 with an adhesive not illustrated.

Each lead 69 integrated with the support wall 67 is located above and approximate to the source electrode 33. The lower end 69a of each lead 69 is joined to the source electrode 33 by a solder 53 such that the lower end 69a and the source electrode 33 do not contact with each other. In this case, the lower ends 69a that are joined to the source electrodes 33 are joining portions. Each solder 53 forms a fillet.

Each lead 69 integrated with the support wall 68 is located above and approximate to the pad 24a of the conductor pattern 24. Each lead 69 is joined to the pad 24a by a solder 54 such that the lead 69 and the pad 24a do not contact with each other. Each solder 54 forms a fillet.

The lower end of each signal terminal 72 integrated with the case 61 is positioned so as to face the pad 25b of the signal pattern 25. The lower end of each signal terminal 72 is joined to the pad 25b of the signal pattern 25 by a solder 55.

A function of the semiconductor module 10 of the present exemplary embodiment will be described hereinafter.

When the semiconductor module 10 is manufactured, the first joining portions 46 of the conductive plates 42 are joined to the signal electrodes 34a, 34b, 34c, 34d, and 34e by soldering, and the second joining portions 47 of the conductive plates 42 are joined to the pads 25a of the signal patterns 25 by soldering. A detailed description will be given hereinafter.

Figure 6:
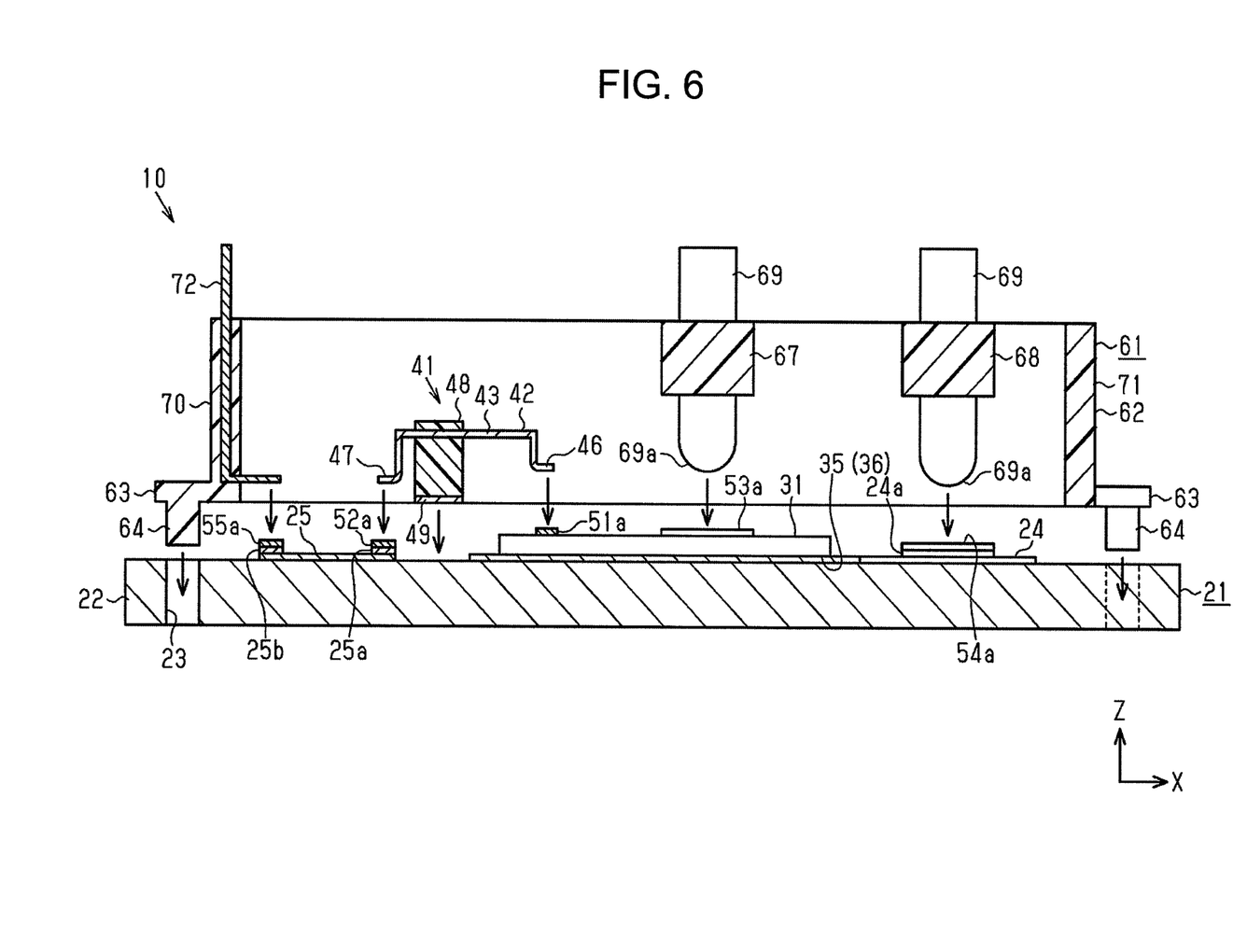
FIG. 6 is a view illustrating a step of a manufacturing process of the semiconductor module.

As illustrated in FIG. 6, when soldering is performed, solder pastes 51a and 52a are disposed on the signal electrodes 34a, 34b, 34c, 34d, and 34e and the pads 25a, and the first joining portions 46 and the second joining portions 47 of the conductive plates 42 are disposed on the solder pastes 51a and 52a, respectively. In this case, the insulating members 48 are bonded to the insulating substrate 22 with the adhesive 49.

Further, in the present exemplary embodiment, since the leads 69 and the signal terminals 72 are also soldered collectively, solder pastes 53a, 54a, and 55a are disposed respectively also on the source electrodes 33 and the pads 24a and 25b. Then, the case 61 is disposed so that the projections 64 of the case 61 are inserted into the through holes 23 of the insulating substrate 22, so that the leads 69 and the signal terminals 72 are positioned. The lower ends 69a of the leads 69 and the lower ends of the signal terminals 72 are brought into contact with the solder pastes 53a, 54a, and 55a, respectively.

The solder pastes 51a, 52a, 53a, 54a, and 55a are melted in a reflow furnace or the like and then hardened, so that the conductive plates 42, the leads 69, and the signal terminals 72 are joined by the solders 51, 52, 53, 54, and 55.

The conductive plates 42 need to stand on their own on the solder pastes 51a and 52a before the conductive plates 42 are joined by the solders 51 and 52. In the present exemplary embodiment, the weight of the insulating members 48 is applied to the conductive plates 42 by disposing the insulating members 48 on the connecting portions 43. Therefore, the weight applied to the substrate 21 from the conductive plates 42 increases, as compared with a case where the insulating members 48 are not provided, so that a center of gravity is stabilized. As a result, the conductive plates 42 are further prevented from falling down. Further, in the present exemplary embodiment, since the insulating members 48 are bonded to the insulating substrate 22, the falling down of the conductive plates 42 is further prevented.

Furthermore, there is a risk that a Manhattan phenomenon may occur due to surface tensions of the melted solder pastes 51a and 52a. However, the occurrence of the Manhattan phenomenon is also prevented by the weight of the insulating member 48 applied to the conductive plates 42.

In particular, when there is a difference in area between the first joining portion 46 and the second joining portion 47 in each conductive plate 42, the falling down of the conductive plate 42 and the Manhattan phenomenon are more likely to occur due to the area difference. However, according to the present exemplary embodiment, although there is the difference in area between the first joining portion 46 and the second joining portion 47 in each conductive plate 42, the falling down of the conductive plate 42 and the Manhattan phenomenon are prevented by the provision of the insulating member 48.

Thus, according to the exemplary embodiment described above, the following effects are obtained.

(1) The insulating members 48 are provided on the connecting portions 43 of the conductive plates 42. Therefore, the weight of the insulating members 48 are applied to the conductive plates 42, so that the falling down of the conductive plates 42 before the conductive plates 42 are joined by the solders 51 and 52 is prevented.

(2) The insulating members 48 are bonded to the insulating substrate 22 with the adhesive 49. As a result, the falling down of the conductive plates 42 is further prevented.

(3) The plurality of conductive plates 42 is integrated by the insulating members 48. Therefore, it is not necessary to position the conductive plates 42 individually when joining the conductive plates 42 and therefore the positioning of the plurality of conductive plates 42 becomes easier.

(4) The lower ends 69a of the leads 69 are spaced apart from the source electrodes 33. As a result, the source electrodes 33 are prevented from being damaged by contacting with the leads 69.

(5) The lower ends 69a of the leads 69 each have the round shape. Therefore, the solders 53 that join the leads 69 and the source electrodes 33 form fillets easily, and the solders 54 joining the leads 69 and the pads 24a form fillets easily.

(6) Since the conductive plates 42 are joined to the signal electrodes 34a, 34b, 34c, 34d, and 34e and the pads 25a of the signal patterns 25 by the solders 51 and 52, the joining of the conductive plates 42 and joining of the leads 69 are performed collectively. If the signal electrodes 34a, 34b, 34c, 34d, and 34e and the pads 25a of the signal patterns 25 are connected to each other by bonding wires, joining of the bonding wires and joining of the leads 69 need to be performed separately. In a case where the bonding wires are joined after the case 61 is attached to the substrate 21, a case 61 of an increased size is required for securing the joining region. According to the present exemplary embodiment, the size of the case 61 does not need to be increased because soldering is performed collectively using the conductive plates 42, so that an increase in the size of the semiconductor module 10 is prevented.

It is to be noted that the exemplary embodiment may be modified as described below.

The insulating members 48 may not be bonded to the insulating substrate 22. In this case, the insulating members 48 may be or may not be in surface contact with the insulating substrate 22. In either case, the weight of the insulating members 48 is applied to the conductive plates 42, so that the falling down of each of the conductive plates 42 before being joined by the solders 51 and 52 is prevented. Further, in a case where the insulating members 48 are in surface contact with the insulating substrate 22, a contact area between the insulating members 48 and the insulating substrate 22 is increased, so that the conductive plates 42 hardly fall down.

Insulating members may be provided individually on the respective conductive plates 42. That is, the plurality of conductive plates 42 may not be integrated.

The number of the conductive plates 42 may appropriately be changed in accordance with the number of the signal electrodes 34a, 34b, 34c, 34d, and 34e.

The adhesive for bonding the insulating members 48 and the insulating substrate 22 may volatilize in a soldering process or the like.

The insulating members 48 may be made of a material other than resin, as long as the insulating members 48 have an insulating property.

The insulating members 48 may be bonded to the case 61.

The lower ends 69a of the leads 69 may be in contact with the source electrodes 33.

The leads 69 and the signal terminals 72 may not be integrated with the case 61.

The lower end 69a of each lead 69 may have a flat shape or the like, that is, each lower end 69a may not have the round shape.

Each of the bare chips 31 may be an insulated gate bipolar transistor (IGBT).

The number of the bare chips 31, the number of the conductor patterns 24, the number of the leads 69, and the like may be changed appropriately.

The insulating member may be provided on a body portion of a chip capacitor having a first joining portion, a second joining portion, and the body portion provided between the first joining portion and the second joining portion.

The areas of the signal electrodes 34a, 34b, 34c, 34d, and 34e may not be the same.

The intervals between the first joining portions 46 of the conductive plates 42 may not be the same as the intervals between the signal electrodes 34a, 34b, 34c, 34d, and 34e of each bare chip 31.

The intervals between the second joining portions 47 of the conductive plates 42 may not be the same as the intervals between the pads 25a of the signal patterns 25.

The area of the first joining portion 46 may be larger than the area of the second joining portion 47.

DESCRIPTION OF REFERENCE NUMERALS 10 semiconductor module
21 substrate
22 insulating substrate
24 conductor pattern
25 signal pattern
31 bare chip
32 upper surface
33 source electrode
34a, 34b, 34c, 34d, 34e signal electrode
35 lower surface
36 drain electrode
42 conductive plate
43 connecting portion
46 first joining portion
47 second joining portion
48 insulating member
51, 52, 53, 54, 55 solder
69 lead
69a lower end

The invention claimed is:

1. A semiconductor module comprising:
a substrate;
a bare chip including a plurality of electrodes disposed on an upper surface thereof and an electrode disposed on a lower surface thereof, the electrode on the lower surface being mounted on the substrate; and
a conductor including a first joining portion that is joined to a control signal electrode of the electrodes disposed on the upper surface of the bare chip, a second joining portion that is joined to a control signal pattern on the substrate, and a connecting portion that electrically connects the first joining portion and the second joining portion, wherein the conductor is a metal plate having a first end portion, a second end portion, and a central portion between the first end portion and the second end portion, the metal plate forming the first joining portion with the first end portion, forming the second joining portion with the second end portion, and forming the connecting portion with the central portion, wherein the first joining portion, the connecting portion and the second joining portion of the metal plate form a U-shape, wherein
the connecting portion is provided with an insulating member,
a plurality of signal electrodes that includes the control signal electrode is provided for the one bare chip,
the conductor is a plurality of conductors that are disposed respectively on the plurality of the signal electrodes, the connecting portions of the plurality of conductors are fixed by the single insulating member, and the insulating member and the substrate are in surface contact with each other.

2. The semiconductor module according to claim 1, wherein the insulating member and the substrate are bonded to each other.

3. The semiconductor module according to claim 1, wherein the bare chip is a plurality of the bare chips, a plurality of leads is formed integrally with a case, the leads being joined to a separate electrode from a signal electrode of a plurality of electrodes disposed on an upper surface of each of the bare chips, and the leads and the separate electrode are joined to each other without contacting with each other.

4. The semiconductor module according to claim 3, wherein a joining portion of each of the leads has a round shape.

\* \* \* \* \*